(12) United States Patent
Jadhav et al.

(10) Patent No.: US 11,094,657 B2
(45) Date of Patent: *Aug. 17, 2021

(54) MULTILAYER PILLAR FOR REDUCED STRESS INTERCONNECT AND METHOD OF MAKING SAME

(71) Applicant: INTERNATIONAL BUSINESS MACHINES CORPORATION, Armonk, NY (US)

(72) Inventors: Virendra R. Jadhav, Endicott, NY (US); Krystyna W. Semkow, Poughquag, NY (US); Kamalesh K. Srivastava, Wappingers Falls, NY (US); Brian R. Sundlof, Verbank, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/502,591

(22) Filed: Jul. 3, 2019

(65) Prior Publication Data

US 2019/0326242 A1 Oct. 24, 2019

Related U.S. Application Data

(60) Continuation of application No. 15/445,058, filed on Feb. 28, 2017, now Pat. No. 10,403,590, which is a
(Continued)

(51) Int. Cl.
*H01L 23/00* (2006.01)
(52) U.S. Cl.
CPC ............ *H01L 24/13* (2013.01); *H01L 23/562* (2013.01); *H01L 24/11* (2013.01); *H01L 24/16* (2013.01); *H01L 24/81* (2013.01); *H01L 2224/0401* (2013.01); *H01L 2224/05666* (2013.01); *H01L 2224/1145* (2013.01); *H01L 2224/11452* (2013.01); *H01L 2224/11462* (2013.01); *H01L 2224/11901* (2013.01); *H01L 2224/13005* (2013.01); *H01L 2224/1308* (2013.01);
(Continued)

(58) Field of Classification Search
None
See application file for complete search history.

(56) References Cited

U.S. PATENT DOCUMENTS 1,652,740 A  12/1927 Shields
2,426,467 A   8/1947 Nelson
(Continued)

OTHER PUBLICATIONS

Kim et al., "Fluxless Bonding of Silicon to Ag-Copper Using In—Ag with Two UBM Designs", IEEE Transactions on Components and Packaging Technologies, vol. 31, No. 04, Dec. 2008; 6 pages.
(Continued)

*Primary Examiner* — Erik T. K. Peterson
(74) *Attorney, Agent, or Firm* — L. Jeffrey Kelly; Andrew M. Calderon; Roberts Calderon Safran & Cole, P.C.

(57) ABSTRACT

A multi-layer pillar and method of fabricating the same is provided. The multi-layer pillar is used as an interconnect between a chip and substrate. The pillar has at least one low strength, high ductility deformation region configured to absorb force imposed during chip assembly and thermal excursions.

14 Claims, 3 Drawing Sheets

Related U.S. Application Data continuation of application No. 14/526,665, filed on Oct. 29, 2014, now Pat. No. 9,640,501, which is a division of application No. 13/431,609, filed on Mar. 27, 2012, now Pat. No. 9,111,816, which is a division of application No. 11/870,583, filed on Oct. 11, 2007, now Pat. No. 8,293,587.

(52) U.S. Cl.
CPC ............ *H01L 2224/13013* (2013.01); *H01L 2224/13023* (2013.01); *H01L 2224/13109* (2013.01); *H01L 2224/13111* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13184* (2013.01); *H01L 2224/13655* (2013.01); *H01L 2224/13666* (2013.01); *H01L 2224/13671* (2013.01); *H01L 2224/13684* (2013.01); *H01L 2224/16235* (2013.01); *H01L 2224/81815* (2013.01); *H01L 2924/00013* (2013.01); *H01L 2924/014* (2013.01); *H01L 2924/01005* (2013.01); *H01L 2924/01006* (2013.01); *H01L 2924/01013* (2013.01); *H01L 2924/01022* (2013.01); *H01L 2924/01024* (2013.01); *H01L 2924/01029* (2013.01); *H01L 2924/01033* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/01082* (2013.01); *H01L 2924/14* (2013.01); *H01L 2924/2064* (2013.01); *H01L 2924/351* (2013.01); *H01L 2924/35121* (2013.01); *H01L 2924/37001* (2013.01); *H01L 2924/384* (2013.01); *Y10T 156/10* (2015.01)

(56) References Cited

U.S. PATENT DOCUMENTS

| | | | |
|---|---|---|---|
| 4,015,948 A | | 4/1977 | Tsuda |
| 4,283,118 A | | 8/1981 | Inoue |
| 4,514,751 A | | 4/1985 | Bhattacharya |
| 5,130,779 A | | 7/1992 | Agarwala et al. |
| 5,197,654 A | | 3/1993 | Katz et al. |
| 5,234,149 A | | 8/1993 | Katz et al. |
| 5,234,153 A | | 8/1993 | Bacon et al. |
| 5,457,345 A | | 10/1995 | Cook et al. |
| 5,461,261 A | | 10/1995 | Nishiguchi |
| 5,471,092 A | * | 11/1995 | Chan ............ H01L 24/05 257/753 |
| 5,571,593 A | | 11/1996 | Arldt et al. |
| 5,816,478 A | | 10/1998 | Kaskoun et al. |
| 5,912,505 A | | 6/1999 | Itoh et al. |
| 6,424,036 B1 | | 7/2002 | Okada |
| 6,489,229 B1 | | 12/2002 | Sheridan et al. |
| 6,713,849 B2 | | 3/2004 | Hasebe et al. |
| 6,724,087 B1 | | 4/2004 | Buynoski et al. |
| 6,881,609 B2 | | 4/2005 | Salmon |
| 6,902,098 B2 | | 6/2005 | Dautartas |
| 6,927,471 B2 | | 8/2005 | Salmon |
| 7,122,458 B2 | | 10/2006 | Cheng et al. |
| 7,273,803 B2 | | 9/2007 | Cheng et al. |
| 7,276,801 B2 | | 10/2007 | Dubin et al. |
| 7,400,042 B2 | | 7/2008 | Eriksen et al. |
| 8,293,587 B2 | * | 10/2012 | Jadhav ............ H01L 24/11 438/121 |
| 8,421,227 B2 | | 4/2013 | Lin et al. |
| 9,084,378 B2 | | 7/2015 | Arvin et al. |
| 9,472,520 B2 | * | 10/2016 | Jadhav ............ H01L 24/13 |
| 10,396,051 B2 | * | 8/2019 | Jadhav ............ H01L 23/562 |
| 10,403,590 B2 | * | 9/2019 | Jadhav ............ H01L 24/81 |
| 2001/0000416 A1 | | 4/2001 | Uzoh |
| 2002/0041013 A1 | | 4/2002 | Wakamiya et al. |
| 2002/0056901 A1 | | 5/2002 | Ono et al. |
| 2002/0058151 A1 | | 5/2002 | Uchikoba et al. |
| 2002/0090756 A1 | | 7/2002 | Tago et al. |
| 2002/0121709 A1 | | 9/2002 | Matsuki et al. |
| 2003/0051912 A1 | | 3/2003 | Dautartas |
| 2003/0094700 A1 | | 5/2003 | Aiba et al. |
| 2003/0132766 A1 | | 7/2003 | Seshan et al. |
| 2003/0136814 A1 | | 7/2003 | Furman et al. |
| 2003/0193094 A1 | | 10/2003 | Takahashi et al. |
| 2003/0203661 A1 | | 10/2003 | Ono et al. |
| 2004/0092141 A1 | | 5/2004 | Salmon |
| 2004/0100164 A1 | | 5/2004 | Murata et al. |
| 2004/0209406 A1 | | 10/2004 | Jan et al. |
| 2005/0001329 A1 | | 1/2005 | Matsuki et al. |
| 2005/0062169 A1 | | 3/2005 | Dubin et al. |
| 2005/0063161 A1 | | 3/2005 | Yanase et al. |
| 2005/0064707 A1 | | 3/2005 | Sinha |
| 2005/0140026 A1 | | 6/2005 | Salmon |
| 2005/0151268 A1 | | 7/2005 | Boyd et al. |
| 2005/0161829 A1 | | 7/2005 | Zeng |
| 2005/0215045 A1 | | 9/2005 | Rinne et al. |
| 2006/0035453 A1 | | 2/2006 | Kim et al. |
| 2006/0043593 A1 | | 3/2006 | Mori et al. |
| 2006/0131728 A1 | | 6/2006 | Salmon |
| 2006/0202346 A1 | | 9/2006 | Shih et al. |
| 2006/0207088 A1 | | 9/2006 | Yamano |
| 2006/0210237 A1 | | 9/2006 | Soeta |
| 2006/0234482 A1 | | 10/2006 | Ploessl et al. |
| 2006/0249847 A1 | | 11/2006 | Eriksen et al. |
| 2007/0001283 A1 | | 1/2007 | Laska et al. |
| 2007/0048994 A1 | | 3/2007 | Tuttle |
| 2007/0120216 A1 | | 5/2007 | Brigante et al. |
| 2007/0267749 A1 | | 11/2007 | Stecher et al. |
| 2008/0001288 A1 | | 1/2008 | Sogawa et al. |
| 2008/0042280 A1 | | 2/2008 | Lin et al. |
| 2008/0083986 A1 | | 4/2008 | Curtis et al. |
| 2008/0135283 A1 | | 6/2008 | Hibino et al. |
| 2008/0169539 A1 | | 7/2008 | Fang et al. |
| 2008/0264681 A1 | | 10/2008 | Iwai et al. |
| 2008/0272497 A1 | | 11/2008 | Lake |
| 2008/0284014 A1 | | 11/2008 | Lee et al. |
| 2008/0308297 A1 | | 12/2008 | Jurenka et al. |
| 2009/0075469 A1 | | 3/2009 | Furman et al. |
| 2009/0166888 A1 | | 7/2009 | Pozder et al. |
| 2010/0243300 A1 | | 9/2010 | Amin et al. |

OTHER PUBLICATIONS

Gelatos et al., "Copper metallization for on-chip interconnects", 346/SPIE vol. 2875; 12 pages.

Uang et al., "The reliability performance of low cost bumping on aluminum and copper wafer", http://ieeexplore.ieee.org/documenU906389/,Electronics Packaging Technology Conference 2000 (EPTC 2000) Proceedings of 3rd, IEEE, Dec. 7, 2010, 2 pages.

Ling et al., "Direct bump-on-copper process for flip chip technologies", http://ieeexplore.ieee.org/documenU1008175/, Electronic Components and Technology Conference 2002 Proceedings 52nd, IEEE, May 28-31, 2002, 3 pages.

Office Action dated Aug. 21, 2020 in related U.S. Appl. No. 16/250,456, 11 pages.

Office Action dated Aug. 21, 2020 in related U.S. Appl. No. 16/502,648, 11 pages.

Office Action dated Feb. 8, 2021 in related U.S. Appl. No. 16/250,456, 10 pages.

Office Action dated Mar. 2, 2021 in related U.S. Appl. No. 16/502,648, 11 pages.

* cited by examiner

MULTILAYER PILLAR FOR REDUCED STRESS INTERCONNECT AND METHOD OF MAKING SAME

FIELD OF THE INVENTION

The present invention relates generally to a multi-layer pillar and method of fabricating the same and, more particularly, to a multi-layer pillar interconnect and method of fabricating the same.

BACKGROUND OF THE INVENTION

Traditionally, high temperature C4 (Controlled Collapse Chip Connection) bumps have been used to bond a chip to a substrate. Conventionally, the C4 bumps are made from leaded solder, as it has superior properties. For example, the lead is known to mitigate thermal coefficient (TCE) mismatch between the package and the substrate. Accordingly, stresses imposed during the cooling cycle are mitigated by the C4 bumps, thus preventing delaminations or other damage from occurring to the chip or the substrate.

However, lead-free requirements imposed by the European Union onto electronic components are forcing manufacturers to implement new ways to produce chip-to-substrate-joints. For example, manufactures have used solder interconnects consisting of copper as a replacement for leaded solder interconnents. More specifically, another type of lead free chip-to-substrate-connection is copper pillar technology. In such joints, a solder C4 bump is replaced with a copper pillar or copper pillars plated onto a chip's Under Bump Metallization (UBM). Such connection allows plating of long (80-100 um), small diameter (30-60 um) copper pillars. Also, such chip to package connections are favorable since they offer higher connection density, superior electrical conductivity and allows more uniform current distribution and heat dissipating performance, and hence potentially increased reliability.

However, copper has a high Young's modulus and a high thermal expansion. This being the case, copper is not an ideal candidate for mitigating thermal coefficient (TCE) mismatch between the chip and the substrate. Accordingly, stresses imposed during the cooling cycle cannot be effectively mitigated by the copper pillars, thus resulting in fractures or delaminations or other damage to the package.

Accordingly, there exists a need in the art to overcome the deficiencies and limitations described hereinabove.

SUMMARY OF THE INVENTION

In a first aspect of the invention a structure comprises a modulated copper pillar having at least one low strength, high ductility deformation region configured to absorb force imposed during chip assembly and thermal excursions.

In another aspect of the invention, an interconnect pillar comprises an intermediate layer interposed between two copper layers. The intermediate layer has a lower modulus of elasticity than that of the two copper layers and thereby is configured to absorb stress imposed during a cooling cycle of an interconnect process which would otherwise be imparted onto a chip.

In another aspect of the invention, a method of forming a structure comprises forming a first copper layer; interrupting the forming of the first copper layer to form an intermediate layer; and forming a second copper layer on the intermediate layer. The intermediate layer has a modulus of elasticity lower than the first copper layer and the second copper layer.

BRIEF DESCRIPTION OF THE DRAWINGS

The present invention is described in the detailed description which follows, in reference to the noted plurality of drawings by way of non-limiting examples of exemplary embodiments of the present invention, in which.

DETAILED DESCRIPTION OF EMBODIMENTS OF THE INVENTION

The present invention relates generally to a multi-layer pillar interconnect and method of fabricating the multi-layer pillar interconnect and, more particularly, to a multi-layer pillar configured and structured to reduce stress at the joint between the pillar and a chip. In embodiments, copper pillar technology is improved by the addition of one or more layers of high ductility and low strength metal as intermediate layers. The metals, in embodiments, have a higher ductility and lower Young's modulus than copper. The addition of one or more layers of metal creates low strength, high ductility "deformation" or stress relieving regions which absorb tensile stresses generated during chip assembly (reflow) processes, e.g., during the cooling cycle of the chip-substrate joining process.

In one mechanism, the intermediate metal layers allow the pillar to tilt and/or slide to compensate for Thermal Coefficient of Expansion (TCE) mismatch between the chip and the substrate (e.g., organic laminate). This may be due to the melting of the material during the heating processes (e.g., peak temperature being about 240° C. to 270° C.). In another mechanism, the intermediate metal layers, being more ductile than copper, can absorb stresses created during the cooling cycle (which would otherwise be imparted onto the chip or copper metallurgy, itself). Thus, by implementing the structures of the invention, stresses normally transmitted to the chip will be absorbed by the intermediate metal layers in the structures of the invention, preventing chip damage and increasing module yield.

First Embodiment of the Invention

Figure 1:
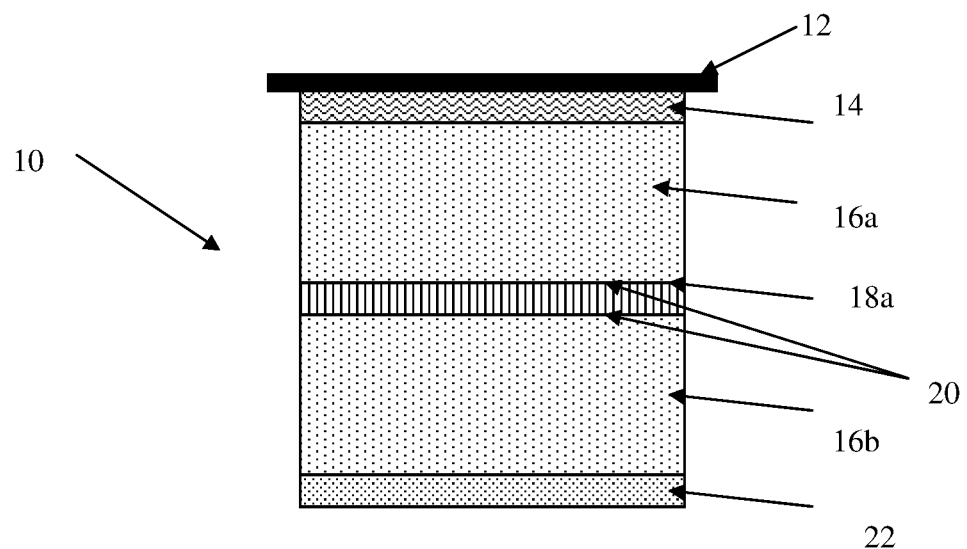
FIG. 1 shows a first implementation of a multi-layer copper pillar in accordance with the invention.

In the embodiment of FIG. 1, a multi-layer pillar in accordance with the invention is generally depicted as reference numeral 10. In embodiments, the multi-layer pillar 10 is typically between 60 to 80 microns in thickness; although any thickness for a particular application is contemplated by the invention. Accordingly, the invention should not be limited to the exemplary illustration of between 60 to 80 microns in thickness, in any of the embodiments.

The multi-layer pillar 10 includes a barrier and adhesion layer 12. In one embodiment, the barrier and adhesion layer 12 may be Titanium Tungsten (TiW); although, other barrier and adhesion materials are also contemplated by the invention. For example, as should be understood by those of skill in the art, the barrier and adhesion layer 12 can be any material which prevents diffusion of materials between a chip (shown in FIG. 5) and materials of the multi-layer pillar 10 or substrate (shown in FIG. 5).

Still referring to FIG. 1, a seed layer 14 is formed on the barrier and adhesion layer 12. In embodiments, the seed layer 14 is Chromium Copper (Cr/Cu). Alternatively, the seed layer 14 is Copper (Cu). The seed layer 14 may be formed by any conventional chemical or physical vapor deposition process (CVD or PVD). As should be understood by those of skill in the art, the seed layer 14 is used for the formation of the copper layer of the pillar, in subsequent processing steps.

A copper layer 16a is formed on the seed layer 14 to a certain height, depending on the particular application. In embodiments, the copper 16a is formed in a high-deposition-rate electroplating bath. At a predetermined time and/or height of the copper column the electroplating of copper is interrupted in order to form a low strength, high ductile layer 18a (e.g., solder-type disc layer) on the copper layer 16a. In embodiments, the formation of the copper column can be interrupted when the copper column is about 5 to 30 um. The low strength, high ductile layer 18a is an intermediate layer of about 5 to 20 microns and more preferably 5 to 10 microns, formed by a deposition process. The deposition process may be provided by an electrolytic bath, in embodiments.

In embodiments, the low strength, high ductile layer 18a is, for example, Tin (Sn), Bismuth (Bi) or Indium (In), depending on the particular application. The Young's modulus (modulus of elasticity) of Sn is 50, the Young's modulus of Bi is 32 and the Young's modulus of In is 11; whereas, the Young's modulus of Cu is 130. Moreover, the rigidity modulus (i.e., the change of shape produced by a tangential stress) of Sn is 18, the rigidity modulus of Bi 12 and the rigidity modulus of In is 12; whereas the rigidity modulus of Cu is 48.

According to the principles of the invention, as the materials of layer 18a are less rigid (of lower strength) than copper, once formed, the entire pillar is capable of sliding or tilting to compensate for Thermal Coefficient of Expansion (TCE) mismatch between the chip and the substrate (e.g., organic laminate) during heating processes. This may be due to the melting of the material during the chip-joining processes (e.g., peak temperature being about 240° C. to 270° C.). In another mechanism, as the materials used for the layer 18a are more ductile than copper, such materials can absorb stresses created during the cooling cycle. That is, the low strength, high ductile layer 18a forms a low strength, high ductile region which absorbs forces imposed during the chip assembly and thermal excursions of the interconnect process thereby absorbing stresses that would otherwise have been transmitted to the chip or copper metallurgy. Thus, by implementing the structures of the invention, stresses normally imposed on the chip or copper metallurgy will be absorbed by layer 18a in the structures of the invention, preventing chip damage, delamination of UBM structure and increasing module yield.

In embodiments, an optional nickel barrier layer 20 (at the interface between the low strength, high ductile layer 18a and the copper layer(s)) can be used to minimize the interaction between high ductile layer 18a and the copper layer(s). In the case that the layer 18a is Sn, the reaction product between copper and tin, a material of higher electrical resistivity, is relatively thicker. In the presence of the optional nickel layer, this reaction product, a material of higher electrical resistivity, between layer 18a and the nickel layer is relatively thinner. In embodiments, the optional nickel barrier layer 20 is approximately 1.0 to 2.0 um in thickness. In further embodiments, the optional nickel barrier layer 20 can be formed on both sides of the low strength, high ductile layer 18a to prevent a reaction between the layer 18a (e.g., solder-type disc layer) and the copper.

A copper layer 16b is formed on the low strength, high ductile layer 18a (or nickel layer 20) to form the remaining portions of the multi-layer pillar 10. Much like the copper layer 16a, a high-rate electroplating bath forms the copper layer 16b. In further embodiments, the tip of the multi-layer pillar 10 can be plated with an optional solder disc 22 to provide a connection to a substrate (FIG. 5) during a reflow process.

Second Embodiment of the Invention

Figure 2:
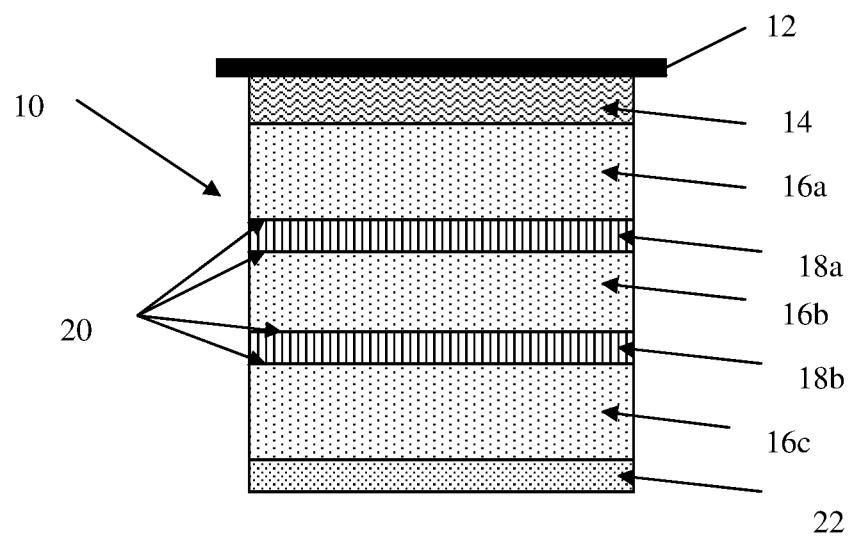
FIG. 2 shows a second implementation of a multi-layer copper pillar in accordance with the invention.

In the embodiment of FIG. 2, the multi-layer pillar is generally depicted as reference numeral 10. As in the embodiment of FIG. 1, the multi-layer pillar 10 is typically between 60 to 80 microns in thickness; although any thickness for a particular application is contemplated by the invention. As discussed below, the embodiment of FIG. 2 includes two or more intermediate layers.

The multi-layer pillar 10 includes a barrier and adhesion layer 12. In one embodiment, the barrier and adhesion layer 12 may be Titanium Tungsten (TiW); although, other barrier and adhesion materials are also contemplated by the invention. Again, the barrier and adhesion layer 12 can be any material which prevents diffusion of materials between a chip (shown in FIG. 5) and materials of the pillar 10 or substrate (shown in FIG. 5).

Still referring to FIG. 2, a seed layer 14 is formed on the barrier and adhesion layer 12. In embodiments, the seed layer 14 is Chromium Copper (Cr/Cu) or Copper (Cu). The seed layer 14 may be formed by any conventional chemical or physical vapor deposition process (CVD or PVD). A copper layer 16a is formed on the seed layer 14 to a certain height, depending on the particular application. In embodiments, the copper layer 16a is formed in a high-rate electroplating bath. In embodiments, the formation of the copper layer 16a can be interrupted when the copper column is about 5 to 30 um.

As discussed above, prior to the formation of the entire pillar 10, the electroplating of copper is interrupted in order to form a low strength, high ductile layer 18a (e.g., solder-type disc layer) on the copper layer 16a. In embodiments, the high ductile metal 18a is an intermediate layer of about 5 to 20 microns and more preferably 5 to 10 microns, formed by a deposition process. The deposition process may be provided by an electrolytic bath, in embodiments. In embodiments, the high ductile metal layer 18a is, for example, Tin (Sn), Bismuth (Bi) or Indium (In), depending on the particular application.

In embodiments, an optional nickel barrier layer 20 (represented as the interface between the low strength, high ductile layer 18a and the copper layer(s)) can be used to prevent the interaction between high ductile layer 18a and the copper layer(s). In the case that layer 18a is Sn, the reaction product between copper and tin, a material of higher electrical resistivity, is relatively thicker. In presence of the optional nickel layer, this reaction product, a material of higher electrical resistivity, between layer 18a and the nickel layer is relatively thinner minimize the interaction between high ductile layer 18a and the copper layer(s). In embodiments, the optional nickel barrier layer is approximately 1.0 to 2.0 um in thickness. In further embodiments, the optional nickel barrier layer 20 can be formed on both sides of the intermediate layer or layers to prevent a reaction between the intermediate layers (e.g., solder-type disc layer) and the copper.

A second copper layer 16b is formed on the low strength, high ductile layer 18a (or nickel layer) to form an additional portion of the multi-layer pillar 10. As with the copper layer 16a, the copper layer 16b can be formed in a high-rate electroplating bath. The electroplating of copper is interrupted again to form a second low strength, high ductile layer 18b (e.g., solder-type disc layer) on the copper layer 16b. In embodiments, the formation of the copper layer 16b can be interrupted when the copper column is about 10 to 30 um.

In embodiments, the low strength, high ductile layer 18b is an intermediate layer of about 5 to 20 microns and more preferably 5 to 10 microns, formed by a deposition process. The deposition process may be provided by an electrolytic bath, in embodiments. In embodiments, the low strength, high ductile layer 18b is, for example, Tin (Sn), Bismuth (Bi) or Indium (In), depending on the particular application.

Again, according to the principles of the invention, as the materials of layers 18a, 18b are less rigid (of lower strength) than copper, once formed, the entire pillar is capable of sliding or tilting to compensate for Thermal Coefficient of Expansion (during heating processes) mismatch between the chip and the substrate (e.g., organic laminate). In another mechanism, as the materials used for the layers 18a, 18b are more ductile than copper, such materials can absorb stresses created during the cooling cycle. That is, the layers 18a, 18b form a low strength, high ductile region which absorb forces imposed during the chip assembly and thermal excursions thereby absorbing stresses that would otherwise have been transmitted to the chip or copper metallurgy. Thus, by implementing the structures of the invention, stresses normally transmitted to the chip or copper metallurgy will be absorbed by the layers 18a, 18b in the structures of the invention, thereby preventing delamination of the UBM layers.

A copper layer 16c is formed on the low strength, high ductile layer 18b (or nickel layer) to form the remaining portion of the multi-layer pillar 10. As with the copper layers 16a and 16b, the copper layer 16c can be formed in a high-rate electroplating bath. In embodiments, the formation of the copper layer 16c can be interrupted when the copper column is about 20 to 30 um. Additionally, an optional nickel layer 20 may be formed at the interfaces between the low strength, high ductile layer 18b and the copper layers 16b, 16c to prevent a reaction between the intermediate layer 18b (e.g., solder-type disc layer) and the copper layers 16b, 16c. In an optional embodiment, the tip of the multi-layer pillar 10 can be plated with an optional solder disc 22 to provide a connection to a substrate (FIG. 5) during a reflow process.

In the embodiments of FIGS. 1 and 2, the number, position and thickness of the low strength, high ductile layers can vary according to technology application and space (e.g. chip size, number of C4 type connections, position of C4 connections on the chip, etc.). Additionally, the above materials for the low strength, high ductile layers can vary depending on the technology, noting that the modulus of elasticity should be lower than that of copper. Also, the number of modulated pillars in accordance with the invention deposited onto a single Under Bump Metallization (UBM) may vary depending on the particular application.

Third Embodiment of the Invention

Figure 3:
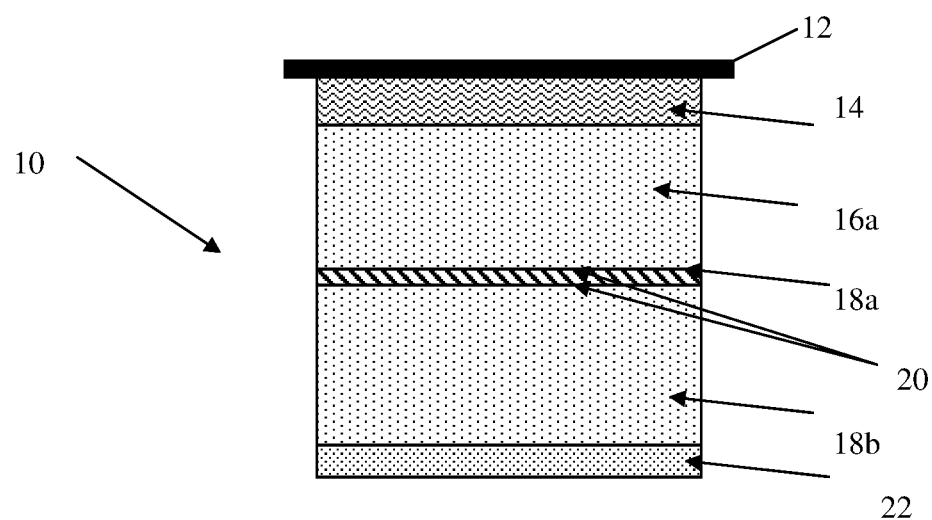
FIG. 3 shows a third implementation of a multi-layer copper pillar in accordance with the invention.

FIG. 3 shows a third embodiment in accordance with the invention. In this embodiment, the multi-layer pillar 10 includes high melting point materials as discussed below. In embodiments, the multi-layer pillar 10 is typically between 60 to 80 microns in thickness; although any thickness for a particular application is contemplated by the invention.

The multi-layer pillar 10 includes a barrier and adhesion layer 12. In one embodiment, the barrier and adhesion layer 12 may be Titanium Tungsten (TiW); although, other barrier and adhesion materials are contemplated by the invention. A seed layer 14 is formed on the barrier and adhesion layer 12. In embodiments, the seed layer 14 is Chromium Copper (Cr/Cu) or Copper (Cu). The seed layer 14 may be formed by any conventional chemical deposition or physical deposition (CVD or PVD) method.

A copper layer 16a is formed on the seed layer 14 to a certain height, depending on the particular application. In embodiments, the formation of the copper layer 16a can be interrupted when the copper column is about 5 to 30 um. In embodiments, the copper layer 16a is formed in a high-rate electroplating bath. The electroplating of copper is interrupted to form a low strength, high ductile layer 18a on the copper layer 16a. In embodiments, the low strength, high ductile layer 18a is an intermediate layer of about 0.2 to 2.0 micron, formed by a deposition process. The deposition process may be provided by an electrolytic bath, in embodiments.

In embodiments, the low strength, high ductile layer 18a is, for example, Gold (Au), Silver (Ag) or Aluminum (Al), depending on the particular application. The Young's modulus (modulus of elasticity) of Au is 78, the Young's modulus of Ag is 83 and the Young's modulus of Al is 76; whereas, the Young's modulus of Cu is 130. Moreover, the rigidity modulus (i.e., the change of shape produced by a tangential stress) of Au is 27, the rigidity modulus of Ag 30 and the rigidity modulus of Al is 26; whereas the rigidity modulus of Cu is 48.

In the embodiment of FIG. 3, the low strength, high ductile layer 18a has a higher melting temperature than lead-free solder and, as such, it does not melt during the assembly processing. And, again, according to the principles of the invention, the materials of low strength, high ductile layer 18a are configured such that the entire pillar is capable of sliding or tilting to compensate for Thermal Coefficient of Expansion (TCE) mismatch between the chip and the substrate (e.g., organic laminate) during the cooling part of the chip joining processes. In another mechanism, the materials used for the low strength, high ductile layer 18a are more ductile than copper and, as such, are capable of absorbing stresses created during the cooling cycle. That is, the low strength, high ductile layer 18a can deform during the cooling cycle thereby absorbing stresses that would otherwise have been imposed on the UBM metallurgy. Thus, by implementing the structures of the invention, stresses normally transmitted to the chip or copper metallurgy will be absorbed by the low strength, high ductile layer in the structures of the invention, preventing delamination of UBM layers, chip damage and increasing module yield.

In embodiments, an optional nickel barrier layer 20 can be formed on both sides of the low strength, high ductile layer 18a to have a reduced reaction product between layer 18a and prevent a reaction between the layer 18a and the copper. A copper layer 16b is formed on the low strength, high ductile layer 18a (or nickel layer 20) to form the remaining portion of the multi-layer pillar 10. Much like the copper layer 16a, a high-rate electroplating process forms the copper layer 16b. In further embodiments, the tip of the multi-layer pillar 10 can be plated with an optional solder disc 22 to provide a connection to a substrate (FIG. 5) during a reflow process.

Fourth Embodiment of the Invention

Figure 4:
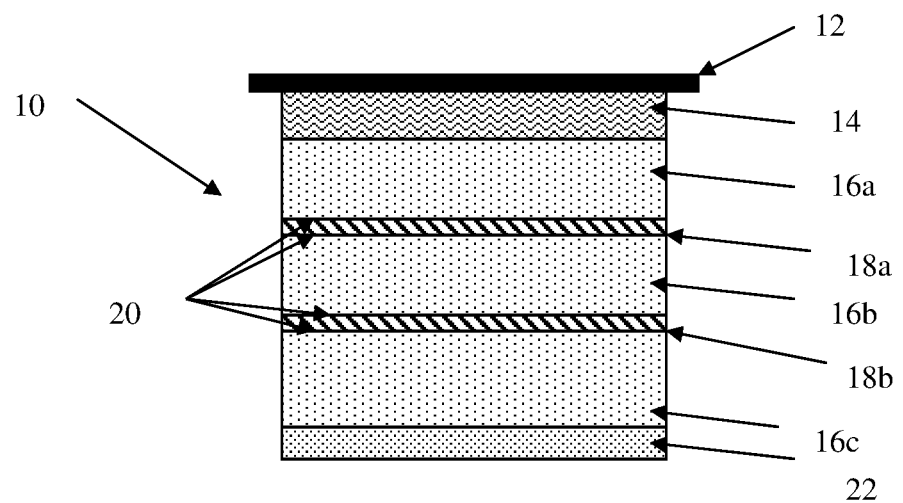
FIG. 4 shows a fourth implementation of a multi-layer copper pillar in accordance with the invention.

In the embodiment of FIG. 4, the multi-layer pillar 10 includes two (or more) intermediate layers, as discussed below. As in the embodiment of FIGS. 1-3, the multi-layer pillar 10 is typically between 60 to 80 microns in thickness; although any thickness for a particular application is contemplated by the invention.

The multi-layer pillar 10 includes a barrier and adhesion layer 12. In one embodiment, the barrier and adhesion layer 12 may be Titanium Tungsten (TiW); although, other barrier and adhesion materials are also contemplated by the invention. Again, the barrier and adhesion layer 12 can be any material which prevents diffusion of materials between a chip (shown in FIG. 5) and materials of the pillar 10 or substrate (shown in FIG. 5).

Still referring to FIG. 4, a seed layer 14 is formed on the barrier and adhesion layer 12. In embodiments, the seed layer 14 is Chromium Copper (Cr/Cu) or Copper (Cu). The seed layer 14 may be formed by any conventional chemical or physical process (CVD or PVD). A copper layer 16a is formed on the seed layer 14 to a certain height, depending on the particular application. In embodiments, the copper 16a is formed in a high-rate electroplating bath.

Again, prior to the formation of the entire multi-layer pillar 10, the electroplating of copper is interrupted in order to form a low strength, high ductile layer 18a on the copper layer 16a. In embodiments, the formation of the copper layer 16a can be interrupted when the copper column is about 5 to 30 um. In embodiments, the low strength, high ductile layer 18a is, for example, Gold (Au), Silver (Ag) or aluminum (Al), depending on the particular application. In embodiments, the low strength, high ductile layer 18a is an intermediate layer of about 0.2 to 2.0 micron, formed by a deposition process. The deposition process may be provided in an electrolytic bath, in embodiments.

In embodiments, an optional nickel barrier layer 20 (at the interface between the intermediate layer 18a and the copper layer(s)) can be formed on both sides of the intermediate layer or layers to prevent a reaction between the intermediate layers and the copper. A second copper layer 16b is formed on the low strength, high ductile layer 18a (or nickel layer) to form an additional portion of the multi-layer pillar 10. As with the layer 16a, the copper layer 16b can be formed in a high-rate electroplating bath. In embodiments, the formation of the copper layer 16b can be interrupted when the copper column is about 10 to 30 um.

In embodiments, the electroplating of copper is interrupted to form a second low strength, high ductile layer 18b on the copper layer 16b. In embodiments, the second high ductile metal layer 18b is, for example, Gold (Au), Silver (Ag) or aluminum (Al), depending on the particular application. In embodiments, the second high ductile metal layer 18b is an intermediate layer of about 0.2 to 2.0 micron, formed by a deposition process. The deposition process may be provided in an electrolytic bath, in embodiments.

A copper layer 16c is formed on the second high ductile metal layer 18b (or nickel layer) to form the remaining portion of the multi-layer pillar 10. As with the layers 16a and 16b, the copper layer 16c can be formed in a high-rate-electroplating bath. Additionally, an optional nickel layer may be formed at the interfaces between the intermediate layer 18b and the copper layers 16b, 16c to prevent a reaction between the intermediate layer 18b and the copper layers 16b, 16c. In an optional embodiment, the tip of the multi-layer pillar 10 can be plated with an optional solder disc to provide a connection to a substrate (FIG. 5) during a reflow process.

In the embodiment of FIG. 4, the layers 18a, 18b have a higher melting temperature than lead-free solder, and, as such do not melt during assembly processing. Additionally, according to the principles of the invention, the materials of layers 18a, 18b permit the entire pillar to slide or tilt to compensate for Thermal Coefficient of Expansion (TCE) mismatch between the chip and the substrate (e.g., organic laminate) during the heating processes. In another mechanism, the layers 18a, 18b are more ductile than copper and, as such, are capable of absorbing stresses created during the cooling cycle. That is, the layers 18a, 18b can deform during the cooling cycle thereby absorbing stresses that would otherwise have been imposed on the UBM metallurgy. Thus, by implementing the structures of the invention, stresses normally transmitted to the chip or copper metallurgy will be absorbed by layers 18a, 18b in the structures of the invention, thereby preventing UBM fatigue and increasing module yield.

In the embodiments of FIGS. 3 and 4, the number, position and thickness of the intermediate layers can vary according to technology application and space (e.g. chip size, number of C4 type connections, position of C4 connections on the chip, etc.). Additionally, the above materials for the intermediate layers can vary depending on the technology, noting that the modulus of elasticity should be lower than that of copper. Also, the number of modulated pillars in accordance with the invention the deposited onto a single UBM may vary depending on the particular application.

STRUCTURE OF THE INVENTION

Figure 5:
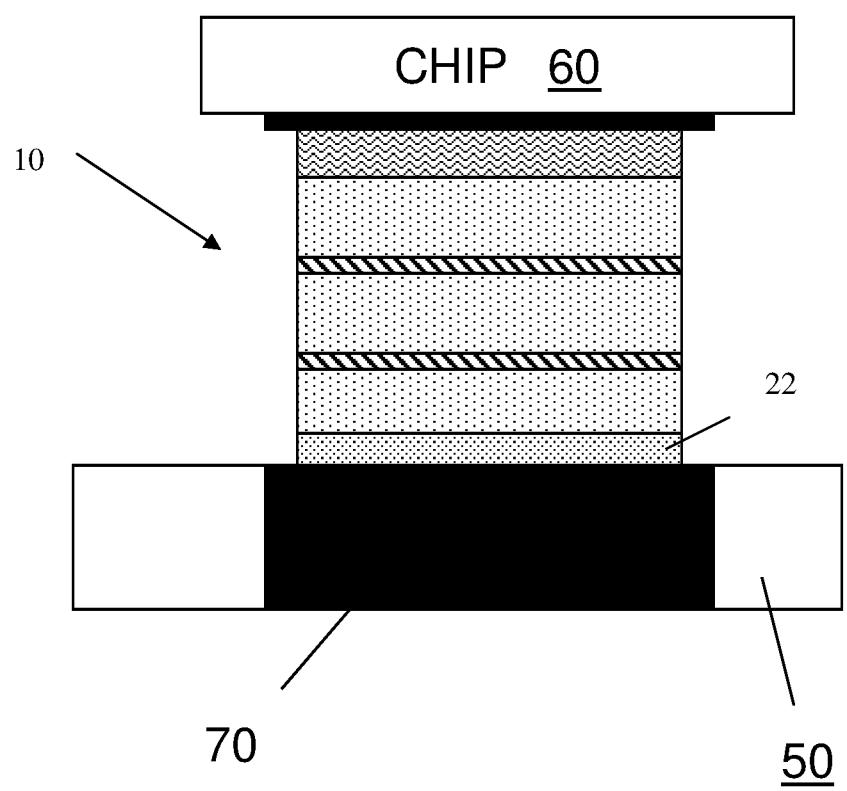
FIG. 5 shows a structure implementing the multi-layer copper pillar in accordance with the invention.

FIG. 5 shows a packaged structure in accordance with the invention. In particular, FIG. 5 shows the utilization of the multi-layer pillar 10 of FIG. 1 bonded to a substrate 50 and a chip 60. It should be recognized that any of the structures discussed above can be implemented with the substrate 50 and chip 60 shown in FIG. 5.

In the structure of FIG. 5, a via 70 is provided in the substrate. The via 70 includes Cu and materials such as, for example, SnCu solder or SnCuAg solder or NiP and Au or Ag, to name a few materials, which can be used to assist in the bonding of the substrate 50 to the multi-layer pillar 10 during the heating process. That is, the material on the via 70 will flow during the heating process, bonding the substrate 50 to the multi-layer pillar 10 or the solder on the copper pillar (disc 22 in FIG. 5) will flow and provide the bonding.

As should be understood by those of skill in the art, the chip 60 has a lower CTE than that of the organic substrate 50. Thus, during the cooling cycle, the substrate 50 will shrink faster than the chip 50. Compared to a conventional structure, as the multi-layer pillar 10 of the invention includes a deformation zone, the stresses created by the substrate 50 (shrinking faster than chip 60) will be absorbed by the multi-layer pillar 10. This will protect the chip from fracture of layers under the UBM during the connection process and thermal excursions thus increasing overall module yield and reliability.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with the structures of the invention) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A method comprising:
   forming a barrier and adhesion layer that connects a modulated copper pillar to a chip;
   forming a seed layer contacting the barrier and adhesion layer;
   forming a first copper layer contacting the seed layer;
   forming a second copper layer contacting a solder material;
   forming at least one deformation region having a modulus of elasticity less than copper between the first copper layer and the second copper layer; and
   forming protective layers interposed at interfaces between a surface of the at least one deformation region and the first copper layer and the surface of the at least one deformation region and the second copper layer,
   wherein each of the protective layers is a nickel barrier layer on a top surface and a bottom surface of the at least one deformation region.

2. The method of claim 1, wherein the at least one deformation region comprises two separate deformation regions between the first copper layer and the second copper layer.

3. The method of claim 2, further comprising forming a third copper layer between the two separate deformation regions.

4. The method of claim 3, wherein at least one deformation region of the two separate deformation regions includes at least one material of gold, aluminum, and silver.

5. The method of claim 4, wherein the at least one deformation region is about 0.2 to 1 microns in thickness.

6. The method of claim 5, wherein a first protective layer of the protective layers is interposed at an interface between an uppermost surface of the at least one deformation region and the first copper layer, and a second protective layer of the protective layers is interposed at an interface between a lowermost surface of the at least deformation region and the second copper layer.

7. The method of claim 6, wherein the first protective layer is a layer of nickel covering the entire uppermost surface of the at least one deformation region, and the second protective layer is another layer of nickel covering the entire lowermost surface of the at least one deformation region.

8. The method of claim 1, wherein the barrier and adhesion layer prevents a diffusion of materials between the chip and the modulated copper pillar.

9. The method of claim 1, wherein the solder material contacts a via in a substrate.

10. The method of claim 1, wherein a vertical sidewall of the first copper layer is aligned with a vertical sidewall of the second copper layer.

11. The method of claim 1, wherein the barrier and adhesion layer comprises titanium tungsten.

12. The method of claim 11, wherein the solder material contacts a via in a substrate, and the via includes nickel phosphorous material.

13. The method of claim 12, wherein the seed layer is chromium copper.

14. The method of claim 13, wherein the at least one deformation region is Aluminum.

* * * * *